(12) United States Patent
Uchida et al.

(10) Patent No.: US 7,210,942 B2
(45) Date of Patent: May 1, 2007

(54) CONNECTION STRUCTURE FOR PRINTED WIRING BOARD

(75) Inventors: Shinji Uchida, Kanagawa (JP); Hiroshi Yamane, Kanagawa (JP); Wataru Sugihara, Kanagawa (JP)

(73) Assignee: J. S. T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/554,692

(22) PCT Filed: Apr. 23, 2004

(86) PCT No.: PCT/JP2004/005951

§ 371 (c)(1),
(2), (4) Date: Oct. 27, 2005

(87) PCT Pub. No.: WO2004/098252

PCT Pub. Date: Nov. 11, 2004

(65) Prior Publication Data

US 2006/0281343 A1    Dec. 14, 2006

(30) Foreign Application Priority Data

Apr. 30, 2003  (JP) .............................. 2003-125679

(51) Int. Cl.
*H01R 12/00* (2006.01)
(52) U.S. Cl. ...................................... 439/67
(58) Field of Classification Search ............ 439/67, 439/68, 65, 495, 69
See application file for complete search history.

(56) References Cited

U.S. PATENT DOCUMENTS

| | | | |
|---|---|---|---|
| 6,010,359 A * | 1/2000 | Etters et al. | 439/496 |
| 6,176,734 B1 * | 1/2001 | Juntwait et al. | 439/493 |
| 6,592,380 B2 * | 7/2003 | Miyazawa et al. | 439/67 |
| 2006/0134969 A1 * | 6/2006 | Takaku et al. | 439/495 |
| 2006/0234521 A1 * | 10/2006 | Uchida et al. | 439/55 |

FOREIGN PATENT DOCUMENTS

| JP | H05-028066 U | 4/1993 |
|---|---|---|
| JP | H09-102368 A | 4/1997 |
| JP | H10-335811 A | 12/1998 |
| JP | 2002-015800 A | 1/2002 |
| JP | 2002-083648 A | 3/2002 |
| JP | 2002-158055 A | 5/2002 |

OTHER PUBLICATIONS

International Search Report mailed on Jun. 15, 2004.

* cited by examiner

*Primary Examiner*—Phuong Dinh
(74) *Attorney, Agent, or Firm*—Rader, Fishman & Grauer PLLC

(57) ABSTRACT

The present invention relates to a connection structure for a printed wiring board to be electrically connected to a FPC. The FPC comprises a long substrate, a plurality of conductors laminated on the surface of the substrate and extending along an axial direction of the substrate. The printed wiring board comprises a planar main wiring board, an insertion opening, and a plurality of the through-hole terminals. Each of the conductors of the FPC abuts the through-hole terminal upon the insertion of the FPC into the insertion opening of the printed wiring board. According to the invention, a connector structure to be connected to FPC is provided inside the printed wiring board in order to mount circuit element in high density, and thus improve degree of freedom in designing wiring pattern.

9 Claims, 5 Drawing Sheets

CONNECTION STRUCTURE FOR PRINTED WIRING BOARD

FIELD OF THE INVENTION

The present invention relates to a structure for a printed wiring board. More particularly, the present invention relates to a structure for a printed wiring board for electrically connecting the printed wiring board formed from laminating a plurality of board members and FPCs (Flexible Printed Circuits).

RELATED ART

Conventionally, electronic component modules and printed wiring boards are mounted in electronic devices. FPC have been used to connect these printed wiring boards and electronic component modules.

The printed wiring board includes an insulating substrate, a wiring pattern which is formed on this substrate, and circuit elements, such as ICs and connectors, which are connected to this wiring pattern on the substrate. ZIF (Zero Insertion Force)-type connectors which can be inserted and removed from FPCs with little force are connectors including the circuit elements (for example, refer to Japanese Patent Application Laid-open Publication No. 2002-158055).

According to this ZIF-type connector, operability of a FPC and a slider can be improved and connection reliability ensured, while realizing miniaturization.

The miniaturization of electronic devices such as mobile phones and mobile devices has been progressing in recent years, and, with this miniaturization of electronic devices, the miniaturization and high levels of integration of FPC and printed wiring boards are also in demand. Therefore, in order to meet this demand, in recent years, multilayer printed wiring boards which stack a plurality of substrates have come into wide use.

However, although the foregoing ZIF-type connector realizes low height, it occupies a certain area on the substrate because it is mounted on a surface of the substrate of the printed wiring board. Therefore, there were cases that mounting circuit elements with high-density became difficult.

In order to solve the above problems, an object of the present invention is to provide a structure for printed wiring boards wherein circuit elements can be mounted with high-density.

SUMMARY OF THE INVENTION

The inventors have invented a structure for printed wiring boards to solve the problems mentioned above as follows.

(1) A connection structure for a printed wiring board to be electrically connected to a FPC, the FPC including: a long substrate, a plurality of conductors laminated on a surface of the substrate and extending along an axial direction of the substrate; the printed wiring board including: a planar main wiring board, an insertion opening provided at an edge surface of the main wiring board and inserted by an end portion of the FPC, and a plurality of the through-hole terminals penetrating from a surface of the main wiring board through an internal wall surface of the insertion opening, the conductor of the FPC abutting each through-hole terminal upon insertion of said FPC into the insertion opening of the printed wiring board.

The FPC may be a FFC (Flexible Flat Cable).

The substrate may be formed of, for-example, a thin film polyimide plate. The substrate may also be laminated with a reinforced plate.

The conductor may be formed of a suitable material having conductivity and formability, such as, for example, a copper alloy plate. The conductor may be plated with nickel or may be treated with conductive hard plating. A base end of the conductor may be coated with a polyimide film.

The conductor may be formed by being laminated (adhered) to the long substrate and etched thereafter. Each of the conductors may be connected to a low voltage power supply or a ground.

Vias, pads-on-holes, and so on, other than the through-hole terminal, may be formed on the printed wiring board. Alternatively, insulating substrates and conductor layers formed on the substrate surface may be laminated on the main wiring board of the printed wiring board. These substrates and conductor layers may be integrated by way of through-hole plating.

The location of the through-hole terminal is not limited but may be appropriately selected corresponding to the location of the FPC conductors. A hole diameter of the through-hole terminal may also be appropriately selected.

According to the invention as described in (1), the connector structure to be connected to FPC is provided inside the printed wiring board in order to mount circuit elements at high density, and thus improve a degree of freedom in designing wiring patterns.

Existing FPC flat conductors can be utilized without any changes and thus reduction of manufacturing cost of the FPC can be achieved.

(2) In the connection structure for the printed wiring board according to (1), the conductor of the FPC is welded to the through-hole terminal by filling a molten solder in the through-hole terminal.

(3) In the connection structure for the printed wiring board according to (1), a press fit pin is pressed in the through-hole terminal.

According to the invention described in (3), the insertion of the press fit pin into the through-hole terminal electrically connects the through-hole terminal and the FPC conductor through the press fit pin.

(4) In the connection structure for the printed wiring board according to (3), the press fit pin includes a main body accommodated in the through-hole terminal, an abutting portion provided on one end side of the main body and penetrating from an internal wall surface of the insertion opening, a circular-shaped flange provided on other end of the main body and exposed to the surface of the printed wiring board.

The shape of the abutting portion of the press fit pin may be of a planar, curved, or spherical shape.

The shape of the main body of the press fit pin is not limited in particular. The main body may be formed in a shape of a rectangular column, for example, a square pole, so that the main body is secured to press an internal circumferential surface of the through-hole terminal. Alternatively, the main body of the press fit pin may be a cylindrical column having an external diameter slightly larger than the internal diameter of the through-hole terminal, and is formed by breaking at a notch along a length of the main body so that the main body can press the internal circumferential surface of the through-hole terminal.

The flange of the press fit pin may have an external diameter corresponding to a front layer land diameter of the through-hole terminal. The flange may be attached to the through-hole terminal by means of soldering.

According to the invention described in (4), the abutting portion of the press fit pin abuts the conductor of a FPC so that the conductor of the FPC and the through-hole terminal can be electrically connected.

(5) In the connection structure for the printed wiring board according to any one of (1) to (4), the main wiring board of the printed wiring board is formed by laminating a first external layer plate, an internal plate having a notch formed at an edge surface, and a second external layer, the through-hole terminal formed on the first external layer plate, the insertion opening formed by having therearound the first external layer plate, the notch in the internal plate, and the second external layer.

The width of the notch may be slightly larger than the width of FPC. The notch can thus control a dislocation of the FPC in a direction of width, allowing an easy alignment of the FPC conductor and the through-hole terminal.

The aforementioned second external layer plate, the internal plate, the first external layer plate and a prepreg as will be discussed later are typically made of an epoxy resin. In addition, these plates and the prepreg may be formed of a material which is not limited to the epoxy resin, but materials having a heat resistance such as a BT resin, etc., may also be used. Furthermore, these plates and the prepreg may be formed of such materials having low dielectric constant properties as low dielectric constant epoxy resins, and polyphenylene ether resins.

A plate thickness of the internal plate is preferably 0.2 mm to 1.6 mm, and more preferably 0.6 mm to 1.0 mm.

The plate thickness of the first external layer plate, the second external layer plate is preferably 0.2 mm. The thickness of a copper foil is preferably 35 micrometers.

(6) In the connection structure for the printed wiring board according to (5), the first external layer plate and the second external layer have wiring patterns formed on both surfaces thereof and further have the prepreg and a copper foil laminated thereon and integrated by way of solder plating.

DETAILED DESCRIPTION OF PREFERRED EMBODIMENTS

Figure 1:
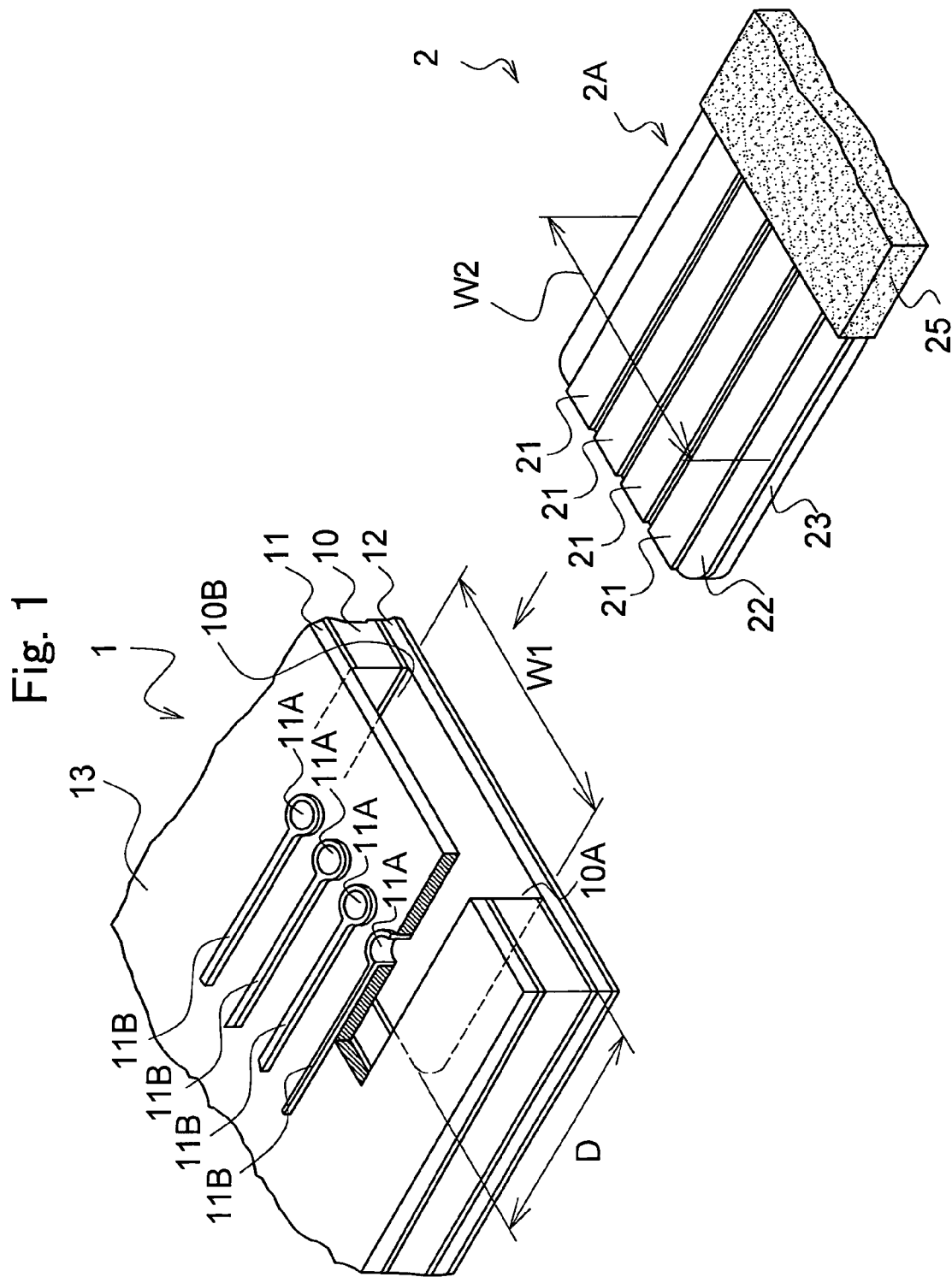
FIG. 1 is a perspective view showing a FPC and a printed wiring board according to a first embodiment of the present invention.

With reference to drawings, each embodiment of the present invention will be described hereinafter in detail. In the description of the embodiments below, identical components are given identical reference numerals and explanation is omitted or simplified for the sake of brevity.

First Embodiment

FIG. 1 is a perspective view showing a FPC 2 and a printed wiring board 1 according to a first embodiment of the present invention.

FPC 2 includes a long substrate 22, a reinforcing plate 23 bonded to the lower surface of the substrate 22, a plurality of conductors 21 laminated on the upper surface of the substrate 22 and extending along an axial direction thereof.

FPC 2 is coated with a polyimide film 25 with an end side is exposed to form an exposed conductor 2A.

The substrate 22 has an insulation property and is formed, for example, of a thin-film polyimide plate.

The exposed conductor 2A has a width W2.

Figure 2:
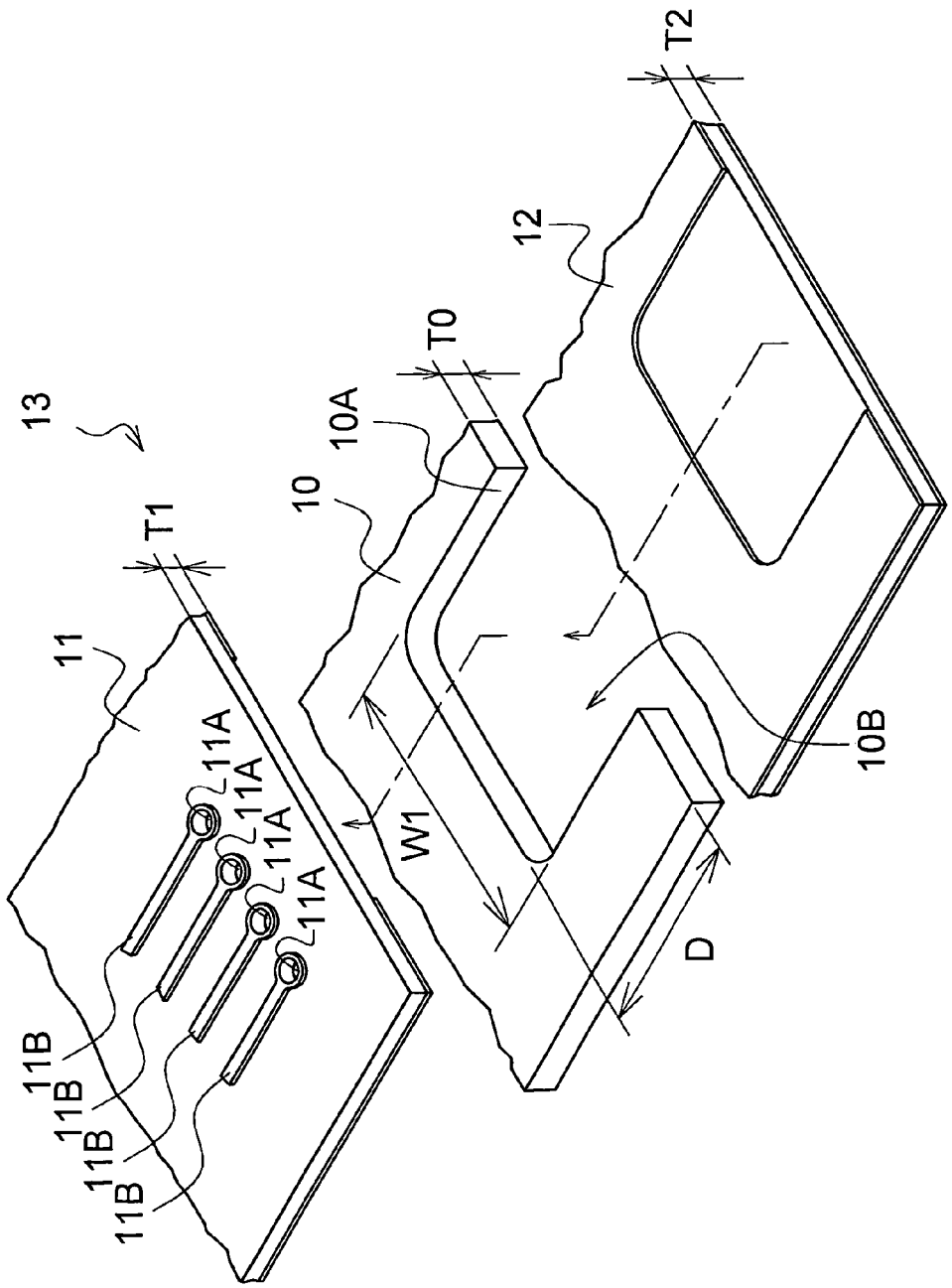
FIG. 2 is an exploded perspective view of a printed wiring board according to the aforementioned embodiment.

FIG. 2 is an exploded perspective view of the printed wiring board 1.

The printed wiring board 1 includes a planar main wiring board 13, an insertion opening 10B provided at an edge surface of the main wiring board 13 so as to have the end portion of the FPC 2 inserted therein, and a plurality of the through-hole terminals 11A penetrating from the surface of the main wiring board 13 through the internal wall surface of the insertion opening 10B.

Here, the main wiring board 13 is configured with a first external layer plate 11, an internal plate 10, and a second external layer plate 12 laminated in this order.

The internal plate 10 is formed of an insulating plate member, or an epoxy glass plate in this embodiment. The internal plate 10 has a plate thickness T0, and has a notch to the edge surface 10A with a width W1 and a depth D.

The first external layer plate 11 has a plate thickness T1, that is 0.2 mm in this embodiment. On both surfaces of the first external layer plate 11, copper foil is print-etched to provide wiring patterns 11B. Specifically, the thickness of the copper foil is 35 micrometers.

The first external layer plate 11 is provided with a plurality of through-hole terminals 11A penetrating through the front and back surface of the plate. These through-hole terminals 11A are arranged in a row such that each terminal intersects the insertion direction of FPC 2 and is connected to the wiring patterns 11B.

The second external layer plate 12 has a plate thickness T2, which is 0.2 mm in this embodiment. On both surfaces of the second external the copper foil is print-etched to provide wiring patterns. Specifically, the thickness of the copper foil is 35 micrometers.

The printed wiring board 1 is manufactured by following steps.

Specifically, the first external layer plate 11, the internal layer plate 10, and the second external layer 12 are laminated and pressed in this order and integrated by solder plating. The integrated plate members 10 to 12 are formed with through-hole terminals, vias, Pads-on-holes etc., and are then subjected to soldering and resist processing.

The first external layer plate 11, the notch 10A of internal plate 10, and the second external layer 12 are provided on the edge surface of the printed wiring board 1 and forms the insertion opening 10B in which the end portion of FPC 2 is inserted.

The plurality of through-hole terminals 11A described above penetrate from the surface of the printed wiring board 1 to the internal wall surface of the insertion opening 10B.

The width W1 of the notch 10A is slightly larger than the width W2 of FPC 2. The notch 10A can thereby limit a displacement of FPC 2 in the width direction, allowing an easy alignment of the conductor 21 of the FPC 2 and the through-hole terminals 11A of the printed wiring board 1.

Figure 3:
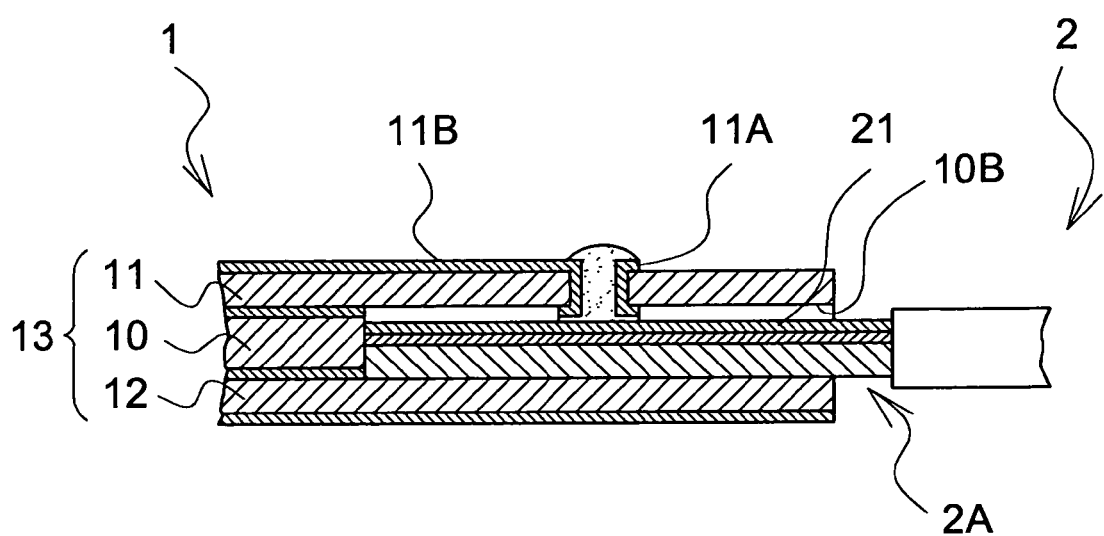
FIG. 3 is a cross-sectional view of a FPC according to aforementioned embodiment inserted in the printed wiring board.

With reference to FIG. 3, a process of the inserting FPC 2 into the printed wiring board 1 will be described.

When the end portion of the FPC 2 is inserted into the insertion opening 10B of the printed wiring board 1, the conductor 21 of the FPC 2 abuts the through-hole terminal 11A. Then, pouring molten solder into the through-hole terminal 11A welds the through-hole terminal 11A and conductor 21 of FPC 2. This electrically connects the printed wiring board 1 and FPC 2.

Second Embodiment

This embodiment differs from the first embodiment in that the press fit pin 3 is pressed into a through-hole terminal 11A.

Figure 4:
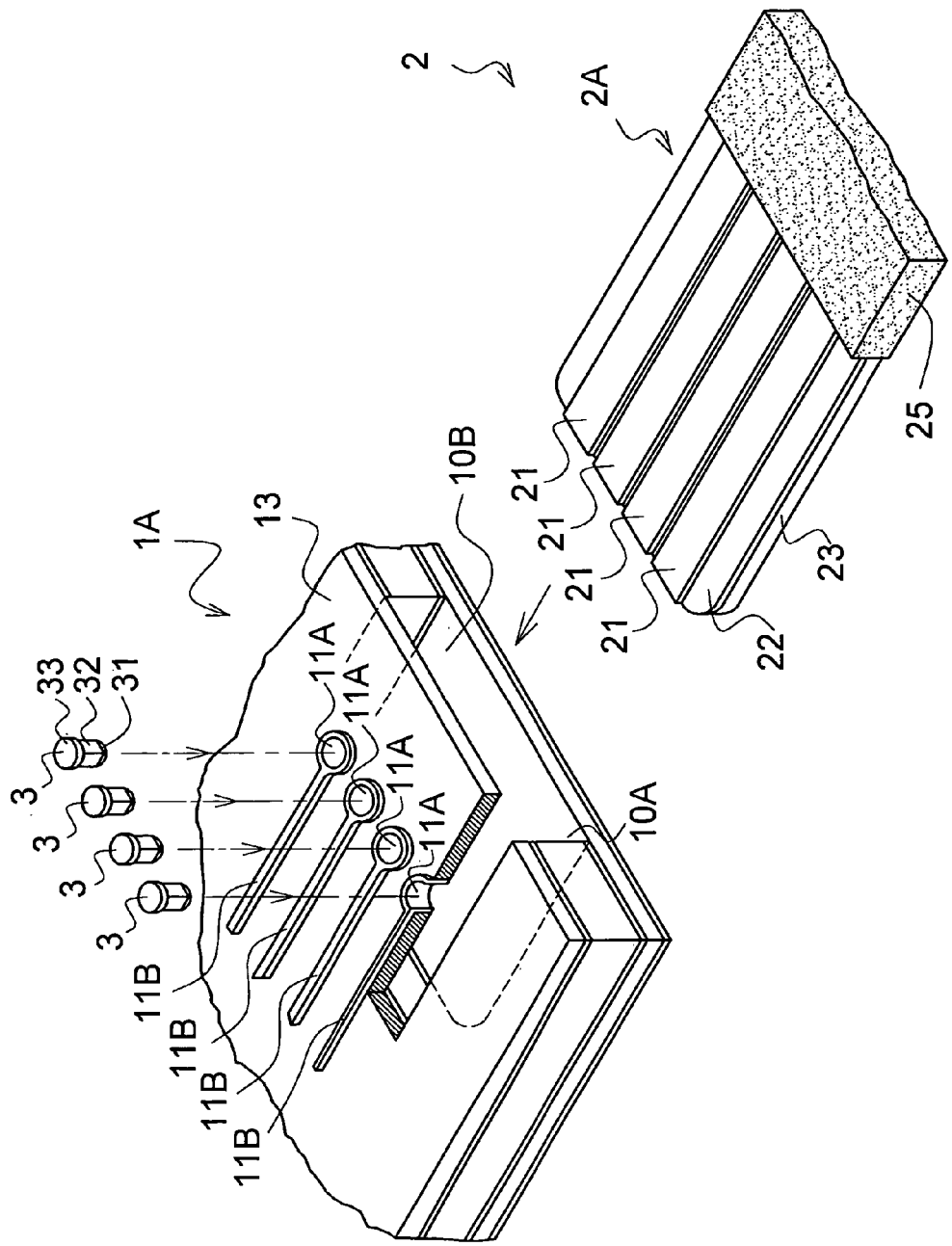
FIG. 4 is a perspective view showing a FPC and a printed wiring board according to a second embodiment of the present invention.

FIG. 4 is a perspective view showing a FPC 2 and a printed wiring board 1A according to the second embodiment of the present invention.

The press fit pin 3 is pressed into the through-hole terminal 11A. The press fit pin 3 comprises a main body 32 accommodated in the through-hole terminal 11A, an abutting portion 31 provided on one end of the main body 32 and projects from the internal wall surface of the insertion opening 10B, a circular-shaped flange 33 provided on other end of the main body 32 and exposed to the surface of the printed wiring board 1.

The abutting portion 31 abuts the conductor 21 of FPC 2. The abutting portion 31 is of a circular shape.

The main body 32 is formed in the shape of a square pole. The distance between a side and an opposing side on a diagonal line of the square pole is formed slightly wider than the internal diameter of the through-hole terminal 11A.

The flange 33 has an external diameter corresponding to a surface land diameter of the through-hole terminal 11A.

Figure 5:
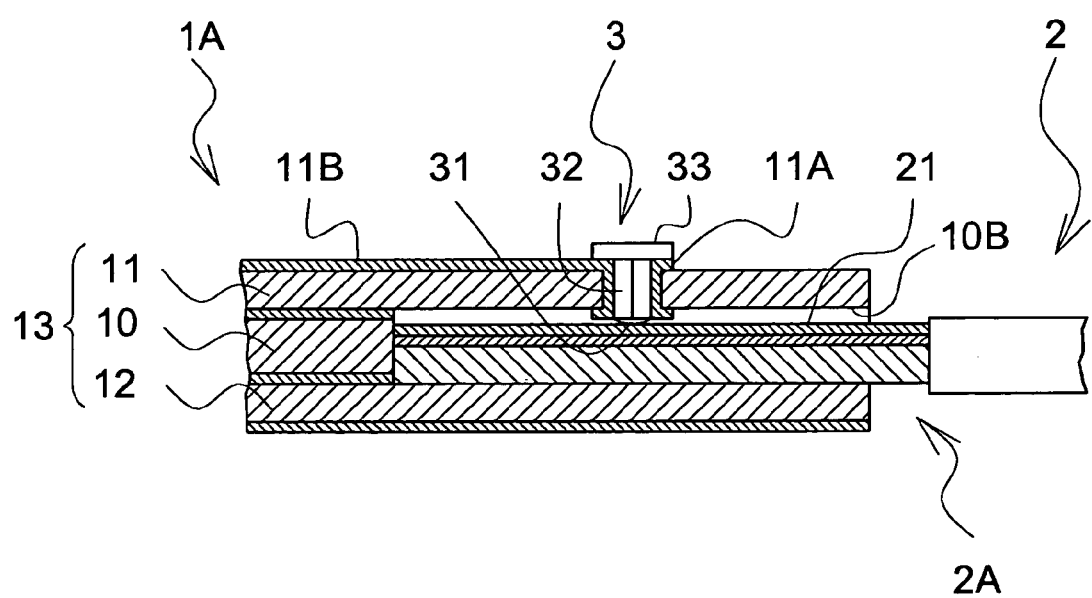
FIG. 5 is a cross-sectional view of a FPC inserted in the printed wiring board according to the aforementioned embodiment.

With reference to FIG. 5, a process of inserting FPC 2 into the printed wiring board 1 will is described.

When the end portion of the FPC 2 is inserted to the insertion opening 10B of the printed wiring board 1A, the conductor 21 of the FPC 2 abuts the abutting portion 31 of the press fit pin 3. This electrically connects the printed wiring board 1A and FPC 2.

According to the present invention, the following advantageous effects are provided.

A connector structure to be connected to FPC is provided inside the printed wiring board in order to mount a circuit element at high density, and thus improve a degree of freedom in designing wiring pattern.

Existing FPC flat conductors can be utilized without any changes and thus reduction of manufacturing cost of the FPC can be achieved.

The invention claimed is:

1. A connection structure for the printed wiring board to be electrically connected to a FPC; the FPC comprising:
    a long substrate; and
    a plurality of conductors, which are laminated on a surface of said substrate, extending along an axial direction of the substrate,
    said printed wiring board comprising:
    a planar main wiring board;
    an insertion opening, which is provided at an edge surface of the main wiring board and inserted by an end portion of said FPC; and
    a plurality of the through-hole terminals, each penetrating from an external surface of said main wiring board and an internal wall surface of said insertion opening,
    wherein each conductor of the FPC abuts a through-hole terminal when said FPC is inserted into the insertion opening of said printed wiring board, and
    wherein said connection structure includes press fit pins, each being press-fitted into a through-hole terminal.

2. The connection structure for the printed wiring board according to claim 1, wherein each conductor of said FPC is soldered to a through-hole terminal by filling a molten solder in said through-hole terminal.

3. The connection structure for the printed wiring board according to claim 1, wherein each press fit pin comprises:
    a main body fitted in said through-hole terminal;
    an abutting portion provided on a first end of said main body, said abutting portion having a projection to contact a conductor of the FPC; and
    a circular-shaped flange provided on a second end of said main body, the circular-shaped flange exposed on a surface of said printed main board.

4. The connection structure for the printed wiring board according to claim 2,
    wherein said main wiring board of said printed wiring board is formed by laminating a first external plate, an internal plate having cutout with an opening at an edge surface of the internal plate, and a second external plate,
    wherein said through-hole terminals are formed on said first external plate, and
    wherein said insertion opening is defined by said first external plate, said cutout and said second external plate.

5. The connection structure for the printed wiring board according to claim 1,
    wherein said main wiring board of said printed wiring board is formed by laminating a first external plate, an internal plate having cutout with opening at an edge surface of the internal plate, and a second external plate,
    wherein said through-hole terminals are formed on said first external plate, and
    wherein said insertion opening is defined by said first external plate, said cutout and said second external plate.

6. The connection structure for the printed wiring board according to claim 3,
    wherein said main wiring board of said printed wiring board is formed by laminating a first external plate, an internal plate having cutout with an opening at an edge surface of the internal plate, and a second external plate,
    wherein said through-hole terminals are formed on said first external plate, and
    wherein said insertion opening is defined by said first external plate, said cutout and said second external plate.

7. The connection structure for the printed wiring board according to claim 4,
    wherein said first external plate and said second external plate, each of which has wiring patterns formed on both surfaces thereof, and a prepreg and a copper foil further laminated thereon, are integrated by way of solder plating.

8. The connection structure for the printed wiring board according to claim 5, wherein said first external plate and said second external plate, each of which has wiring patterns formed on both surfaces thereof, and a prepreg and a copper foil further laminated thereon, are integrated by way of solder plating.

9. The connection structure for the printed wiring board according to claim 6, wherein said first external plate and said second external plate, each of which has wiring patterns formed on both surfaces thereof, and a prepreg and a copper foil further laminated thereon, are integrated by way of solder plating.

* * * * *